United States Patent [19]

Schuller et al.

[11] 4,430,183

[45] Feb. 7, 1984

[54] METHOD OF MAKING COHERENT MULTILAYER CRYSTALS

[75] Inventors: Ivan K. Schuller; Charles M. Falco, both of Woodridge, Ill.

[73] Assignee: The United States of America as represented by the United States Department of Energy, Washington, D.C.

[21] Appl. No.: 424,702

[22] Filed: Sep. 27, 1982

Related U.S. Application Data

[62] Division of Ser. No. 202,083, Oct. 30, 1980, abandoned.

[51] Int. Cl.$^3$ ............................................. C23C 15/00
[52] U.S. Cl. ............................ 204/192 C; 204/192 S
[58] Field of Search ......... 204/192 R, 192 C, 192 SP, 204/192 S, 192 P

[56] References Cited

U.S. PATENT DOCUMENTS

3,856,647  12/1974  Blachman ..................... 204/192 SP
4,093,349   6/1978  Mills ............................... 204/192 P Primary Examiner—M. J. Andrews
Attorney, Agent, or Firm—Walter L. Rees; James W. Weinberger

[57] ABSTRACT

A new material consisting of a coherent multilayer crystal of two or more elements where each layer is composed of a single element. Each layer may vary in thickness from about 2 Å to 2500 Å. The multilayer crystals are prepared by sputter deposition under conditions which slow the sputtered atoms to near substrate temperatures before they contact the substrate.

6 Claims, 4 Drawing Figures

METHOD OF MAKING COHERENT MULTILAYER CRYSTALS

CONTRACTUAL ORIGIN OF THE INVENTION

The United States Government has rights in this invention pursuant to Contract No. W-31-109-ENG-38 between the U.S. Department of Energy and Argonne National Laboratory.

This is a division of application Ser. No. 202,083, filed Oct. 30, 1980, now abandoned.

BACKGROUND OF THE INVENTION

This invention relates to a new material. More specifically, this invention relates to a new multilayer crystal consisting of ultrathin, coherent, alternating layers of materials which are not semiconductor compounds having a crystalline structure. The invention also relates to a method of making this new multilayer crystal material.

Single crystal, multilayered structures having component layers that differ in composition but which are lattice-matched, generally known as superlattices, form the basis for a number of different semiconductor devices. The semiconductors supperlattice have been used to prepare solid state lasers and as optical modulators, optical switches, waveguides and couplers.

It has been universally accepted that these structures can only be produced without defects if the constituents have the same crystal structure and closely matching lattice parameters. The defects or dislocations result when the lattice parameters differ too greatly, imposing an elastic strain upon the lattice. In addition, if the components are not properly matched, diffusion will occur which will destroy the superlattic structure.

Heretofore, these superlattice structures have only been prepared of alternating layers of semiconducting compounds. The constituents are usually binary compounds of one of the group IIIA elements Al, Ga and In and one of the Group V elements P, As and Sb. The superlattices are then formed by layering, for instance GaAs and AlAs. These have the same crystal structure and only a small variation in lattice spacing. These semiconductor superlattice structures may be formed by a number of different techniques. For example, a superlattice structure is produced by epitaxially growing a semiconductor material such as GaAs, which is periodically doped so as to produce alternating ultrathin layers having different conductivity types. More recent methods for the preparation of semiconductor superlattices include vapor phase and liquid phase epitaxy. Molecular beam epitaxy has become particularly successful because it provides the ultra high vacuum and high purity conditions believed necessary to produce high quality superlattice material. However, none of these methods have been successful in producing multilayered crystals from materials which are not semiconductor compounds.

SUMMARY OF THE INVENTION

It has been found that it is possible to prepare an artificial superlattice structure where the constitutents have different crystal structure and large differences in their lattice parameters by sputter deposition under carefully controlled conditions. The new material consists of a coherent, multilayer crystal of two or more elements, each layer being of a single crystalline element at least 2 Å in thickness. The crystal may be composed of any two or more elements which will grow epitaxially on each other without forming an intermetallic compound.

The multilayered structure of the invention is preferably prepared by sputter depositing alternate layers of material onto an appropriate substrate under conditions which promote epitaxial or crystalline growth. Epitaxial growth has been found to occur when the thermal energy of the sputtered atoms has been slowed to about the temperature of the substrate. This is accomplished by controlling both the distance from the source to the substrate and the pressure of the sputtering gas.

The process of the invention for preparing multilayer crystals of two or more elements consist of placing a suitable substrate crystal into a vacuum vessel which contains a sputtering gun for forming a beam of atoms for each element in the crystal, the substrate being at least 10 cm from the source of the beams. The ambient gas is removed from the vessel and a pressure of sputtering gas of at least $5 \times 10^{-3}$ Torr is established. The substrate is then heated to from 150° to 450° C. and a beam of sputtered atoms is established from each sputtering gun. The pressure of the sputtering gas in the chamber and the distance of the source of the beams to the substrate is then adjusted to reduce the temperature of the atoms as they reach the substrate to about the temperature of the substrate, so that the atoms as they contact the substrate will form a crystalline structure and will not dispace or eject the atoms in the lower layers. Each beam of sputtered atoms is then passed alternately over the substrates to deposit a plurality of alternate coherent layers of at least two crystalline materials on the substrate and form a coherent multilayer crystal.

Multilayer crystals may be prepared from a number of different elements and combination of elements by this method and many are expected to exhibit interesting and useful properties. For example, multilayer crystals of alternating layers of copper and niobium and of titantium and niobium have been found to exhibit superconducting properties in which the $T_c$ of the material has been found to be dependent upon the thickness of the layers.

It is therefore one object of the invention to provide a new material which is a multilayer crystal comprised of at least two elements which are not semiconducting compounds.

It is another object of the invention to provide a new material which is a multilayer crystal having superlattice structure of alternating coherent, ultrathin layers of different elements which are not semiconducting compounds and in which the layers may be as thin as 2 Å.

It is still another object of the invention to provide a coherent multilayer crystal having superconducting properties.

It is still another object of the invention to provide a method for preparing a coherent, multilayer crystal from two or more elements which have dissimilar crystal structure and lattice parameters.

Finally, it is the object of the invention to provide a method for preparing a coherent multilayer crystal from two or more elements which have dissimilar crystal structure and lattice parameter by sputter diposition.

DETAILED DESCRIPTION OF THE PREFERRED EMBODIMENT

Figure 1:
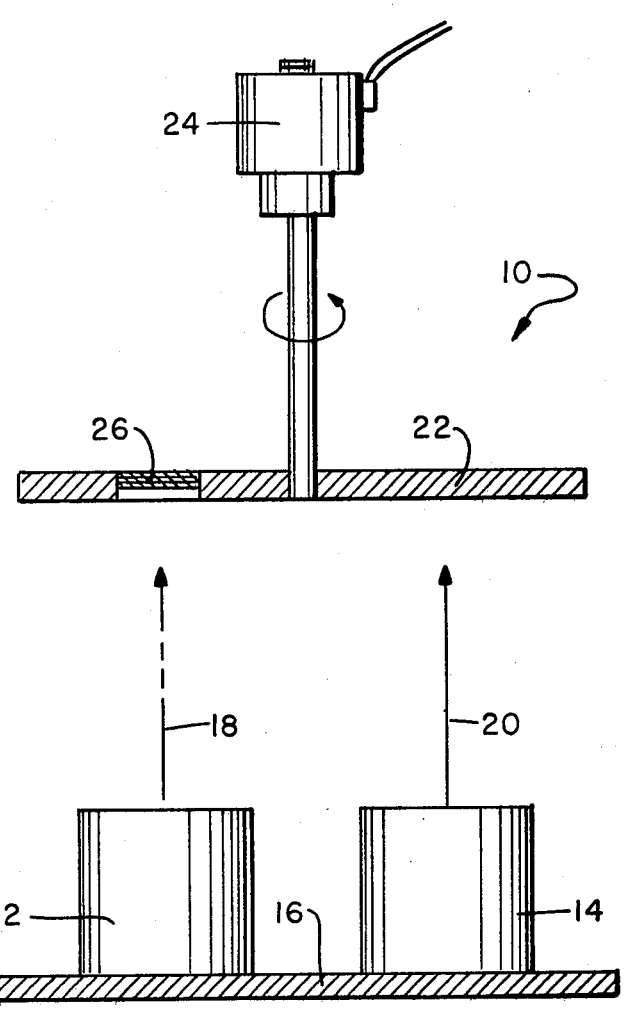
FIG. 1 is a drawing of the sputtering device used to prepare the multilayer crystals of the invention.

These and other objects of the invention for preparing multilayer crystals from at least two different elements may be met by selecting an appropriate substrate crystal such as sapphire which is placed into a vacuum chamber containing a sputtering gun for forming a beam of atoms for each element in the crystal, the gun being capable of sputtering of a rate between 10 and 100 Å per second. The elements may be any two from the group of niobium, copper, nickel or silver. The substrate is positioned about 15" from the source of the beams. The vessel is sealed and the ambient gas pumped from the vessel before a argon sputtering gas pressure of about $6 \times 10^{-3}$ Torr is established. The substrate is heated to about 200° C. and a beam of sputtered atoms is established from each sputtering gun. The sputtering gas pressure and the distance from the source of the beams of atoms to the substrate must be sufficient to reduce the temperature of the atoms in the beam as they reach the substrate to about the same temperature as the substrate so that as the atoms contact the substrate they have sufficient energy to form a crystalline structure but not enough energy to displace or eject atoms in the crystal or in layers already formed. The multilayer crystal is formed by alternately passing each beam of sputtered atoms over the substrate to deposit a plurality of alternate coherent layers of at least two crystalline materials on the substrate to form a coherent multilayer crystal.

The material of the invention may be prepared from any combination of elements which will not form intermetallic compounds with each other under the deposition conditions and which will grow epitaxially on each other. Pairs of elements known to form layered ultrathin coherent structures include niobium and copper, niobium and nickel, nickel and silver, and niobium and titanium. Specific elements which should form the layered structures, may be any combination of the following: Co, Ge, Si, Nb, Fe, Ag, Ni, Cu, Al, Mo, Ta, W, V, Ru, Au, and Pd. The layered structure is not limited to only two different elements but may consist of any number of different elements which meet the criteria for epitaxial growth and non-formation of intermetallic compounds.

The epitaxial growth characteristics of many of the various elements relative to each other and appropriate substrates can be determined by reference to Epitaxial Growth, Part B, Materials Science Service, edited by J. W. Matthews, Academic Press, New York 1975.

The substrate may be any substance upon which the particular material to be deposited is known to grow epitaxially such as sapphire. Other appropriate substrates can be determined by reference to the hereinbefore cited publication.

Substrate deposition temperatures will vary according to the material to be deposited and upon the substrate to be used, but may generally vary from about 150° to 450° C. Temperatures for other materials can readily be determined by one skilled in the art.

Preferably, the layered superlattice structure is prepared by sputter deposition. Referring now to FIG. 1, the sputtering apparatus 10 is enclosed in a vacuum vessel (not shown) and consists of a pair of sputtering guns 12 and 14 spaced 10 inches apart and mounted on base 16 so that their respective beams 18 and 20 are parallel. Adjustably mounted about 15" above guns 12 and 14, perpendicular to the beams is a table 22 rotated by a motor 24 having a controlled rotational speed. A suitable substrate 26 is mounted on table 22 so that it passes sequentially through beams 18 and 20. The substrate may be heated by a quartz lamp (not shown). In this manner, deposits from each sputtering gun are sequentially layered upon the substrate. The sputtering is performed under a partial pressure of inert gas and sputtering rates are controlled by keeping the sputtering pressure and power constant. The layers may range in thickness from one atomic layer (about 2 Å) to as thick as desired but generally no more than 2500 Å. The thickness at the individual layers is controlled by varying the rotational speed of table 22 which determines the length of time the substrate is in the path of each beam.

While the sputtering device may be of any of the well known types, it is preferred that they be capable of a high rate of sputtering, on the order of 10 to 100 Å per second. Sputtering is generally done at rates varying from 40 to 60 Å per second, preferably 50 Å per second. This enables the layers to be deposited rapidly while reducing the possibility of contamination from foreign elements in the gas such as oxygen which could disrupt the layered structure. One sputtering apparatus found to have a suitable rate of deposition is a dc magnetron although other types of apparatus such as rf sputtering may also be satisfactory.

The sputtering gas is any high purity inert gas suitable for sputtering, such as argon. The pressure of the gas in the vacuum vessel is important and is preferably at least $5 \times 10^{-3}$ Torr and may range as high as $20 \times 10^{-3}$ Torr as will be explained hereinafter.

It is important for the successful preparation of coherent multilayer crystals of elements having dissimilar lattice structures and parameters by sputter deposition, that the speed of the atoms in the sputtered beam be slowed down before they reach the substrate, so that as the atoms contact the substrate they have sufficient energy to form a crystalline structure but are not so energetic as to cause the displacement or ejection of any atoms in the substrate or in one of the layers already formed. It has been determined that this energy is equivalent to the temperature of the substrate. This slowing down of the sputtered atoms is accomplished by adjusting the distance between the source of the beam of sputtered atoms and the substrate so that the sputtered atoms have enough collisions, generally believed to be larger than 8 to 10 so that the thermal velocity of the atom is about equal to the thermal velocity of the sputtering gas which is in turn about equal to the temperature of the substrate. Thus by increasing the gas pressure, more atoms of gas are available for collisions, while increasing the distance from source to substrate also increases the chance for collisions and thus thermalization of the sputtered atoms. Thus the source to substrate distances may vary from about 10 to 50 cm. For the multilayer crystal structures which have prepared thus far, distances of about 38 cm (15 inches) at gas pressures of about 4 to $6 \times 10^{-3}$ Torr have been found to be satisfactory.

The following Examples are given only to illustrate the invention and are not to be taken as limiting the scope of the invention which is defined by the appended claims.

EXAMPLE I

A material consisting of alternating coherent layers of niobium and copper was prepared by sputter deposition using the apparatus previously described containing two high rate (~50 Å/sec) dc magnetron sputtering guns. The sputtering chamber was initially pumped to $5.2 \times 10^{-7}$ Torr and after argon was admitted was maintained at about $5.7 \times 10^{-3}$ Torr. A sapphire substrate mounted on the rotating table was heated to about 200° C. and was passed through the beams at 13.6 rpm. The Cu target power was 930 watts and the Nb target power was 1.8 kW. A total sputtering time of 13 minutes, 37 seconds produced a structure having a total thickness of 1.1 micrometers with an individual layer thickness of 28 Å.

EXAMPLE II

Figure 2:
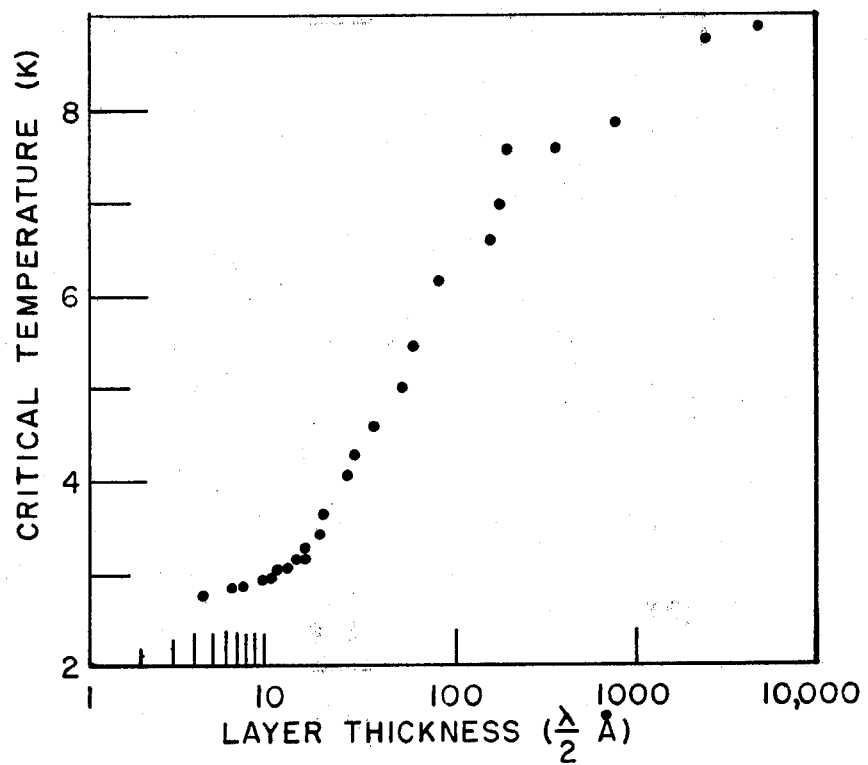
FIG. 2 is a curve showing the relationship between $T_c$ and layer thickness for multilayer crystals of niobium and copper.

To characterize the material, Ion Mill Auger Spectroscopy was performed on a sample prepared in a manner similar to that of Example I. To depth profile the chemical composition of the sample, it was bombarded with 1keV Xe ions. This slowly mills the surface of the films, while simultaneously the Auger spectrum is analyzed. The spectrum, shown in FIG. 2, displays a regular oscillation in Cu concentration verses depth indicating the presence of regular copper layers.

EXAMPLE III

A niobium-nickel structure was prepared by sputter deposition onto a sapphire substrate at 200° as described hereinbefore. The argon pressure was $8.6 \times 10^{-3}$ Torr while the target power was 1.5 and 1.7 kW for the nickel and niobium targets respectively. At a rotational speed of 8 rpm and a total deposition time of 17 minutes, 13 seconds, the total structure thickness was 6100 Å with the layers 30 Å thick each. X-Ray diffraction studies confirmed that the different layers were each 30 Å in thickness.

EXAMPLE IV

Figure 3:
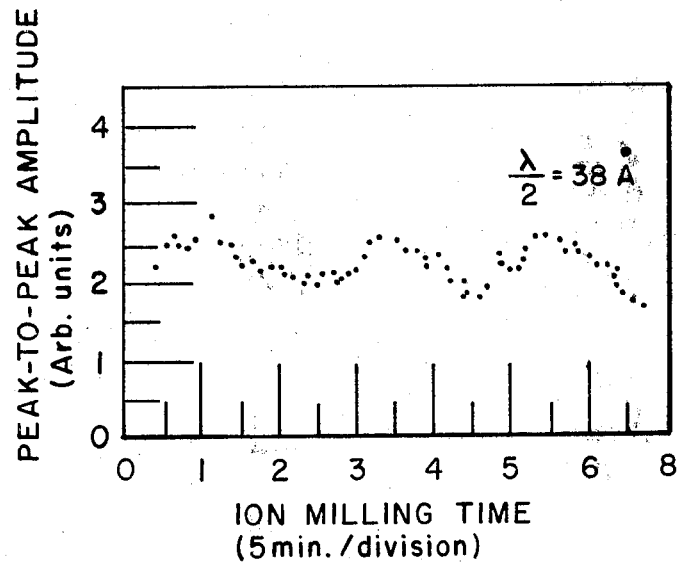
FIG. 3 is a graph of the depth profile of the copper concentration for a niobium-copper multilayer crystal in which each layer is about 38 Å thick.

A number of layered niobium-copper crystals were tested for superconductivity using a standard test. The results, shown in FIG. 3, displays the unusual dependence of the superconducting transition temperature on the layer thickness. This indicates that the transition temperature of the material can be tuned by carefully controlling the layer thickness.

EXAMPLE V

A multilayer crystal of niobium-titanium was prepared by sputter deposition on a sapphire substrate as described before. The substrate to atom source distance was 15 inches and the substrate temperature was held at about 200° C. The sputtering gas pressure was $6 \times 10^{-3}$ Torr. The power of the gun containing the titanium target was 1.3 kW to provide a sputtering rate of 20 Å per sec while the power of the gun containing the niobium target was 1.25 kW to attain a similar ratio. The substrate was rotated at 30 rpm for 40 minutes to prepare a crystalline structure 2 micrometers in total thickness. The thickness of each layer was estimated to be 10 Å which was confirmed by X-ray diffraction.

EXAMPLE VI

Figure 4A:
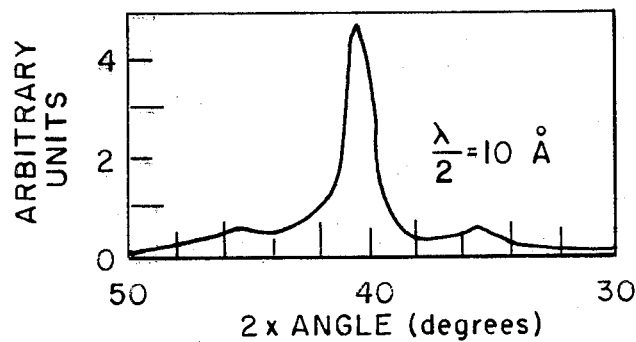
FIG. 4 is a series of graphs showing the x-ray diffraction curves for several niobium-copper multilayer crystals having increasing layer thickness.
Figure 4B:
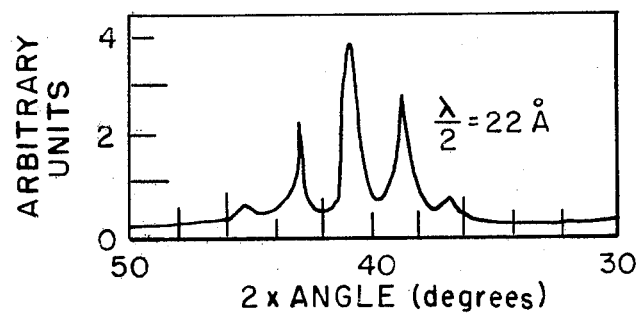
Figure 4C:
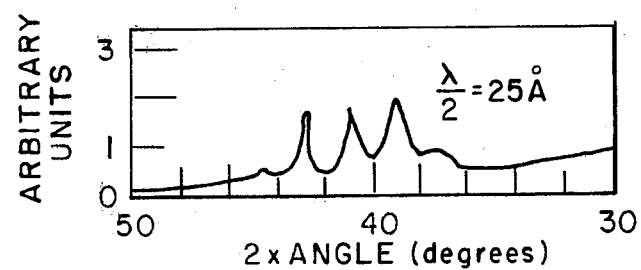
Figure 4D:
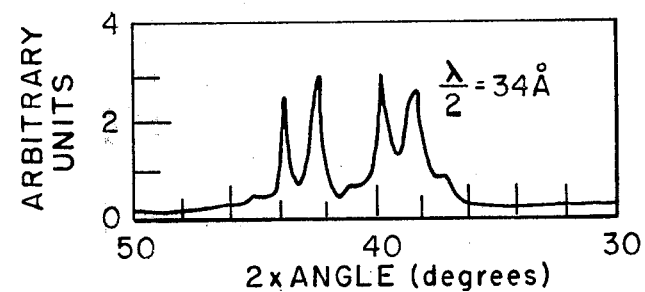
Figure 4E:
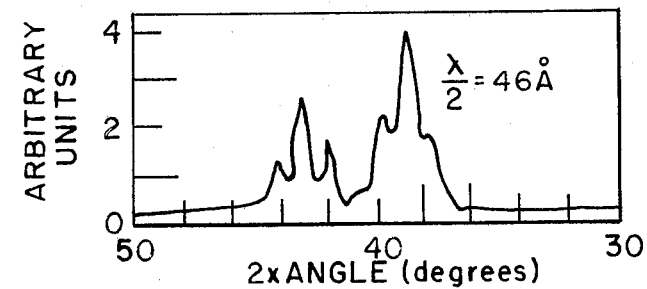

A number of samples of niobium-copper superlattice materials having different layer thicknesses in the range of 10 to 100 Å were studied using ordinary X-ray diffraction techniques. The sample and the detector were rotated synchronously so as to keep the source-sample angle equal to the sample-detector angle. In this fashion the measurement is only sensitive to changes in scattering function and strains perpendicular to the x-y plane of the film and layers. Shown in FIG. 4a through 4c are the results for materials having increasing layer thickness. FIG. 4a shows one central peak located midway between the pure Nb and Cu peaks and two additional satellite peaks symmetrically spaced around the central peak. It can readily be seen from FIG. 4 that there is a continuous consistent way in which the x-rays evolve from the small wave length limit to the large one. This consistent evolution can be directly related to the presence of the superlattice. Up to eleven distinct peaks were observed and X-ray line widths were within fractions of two of the diffractometer resolutions. Samples that had been aged for more than six months did not show any noticeable change in their diffraction properties.

Thus it can be seen from the preceding discussion and Examples that the invention provides a new superlattice crystal of elements not known previously to be ameniable to the formation of the coherent multilayer crystalline structure and to a method for preparing such structure.

The embodiments of this invention in which an exclusive property or privilege is claimed are defined as follows:

1. A process for forming a multilayer, superlattice crystal having parallel, ultrathin alternating layers of two different metal elements comprising:

placing a substrate suitable for epitaxial growth into a vacuum vessel;

removing the ambient gas from the vessel;

establishing a pressure of sputtering gas of at least $5 \times 10^{-3}$ torr in the vessel;

heating the substrate to about 150° to 450° C.;

establishing two beams of sputtered atoms, one beam for each metal element of which the crystal is to be formed, the metals being elements which will grow epitaxially on each other;

adjusting the thermal energy of the atoms in each beam so that the temperature of the atoms as they reach the substrate, is about the temperature of the surface of the substrate, whereby the atoms in the beam do not displace or eject atoms in layers already deposited on the surface but grow epitaxially on the layers to form a superlattice crystal structure; and alternately passing each beam of sputtered atoms over the the substrate to deposit alternate layers of the two metal atoms epitaxially on the surface and on each other, each layer being from 2 to 2500 angstroms in thickness, thereby forming a multilayer, superlattice crystal having parallel, ultrathin alternating layers of two different metal elements.

2. The process of claim 1 wherein the thermal energy of the atoms in each beam is adjusted by varying the distance between the source of the beam of atoms and the surface of the substrate and by varying the pressure of the sputtering gas in the vessel.

3. The process of claim 2 wherein the elements from which the crystal is formed are selected from the group consisting of Co, Ge, Si, Nb, Fe, Ag, Ni, Cu, Al, Mo, Ta, W, V, Ru, Au and Pd.

4. The process of claim 3 wherein the sputtering gun is a high rate sputtering gun capable of sputtering at a rate of 10 to 100 Å per second.

5. The process of claim 3 wherein the sputtering gun is a dc magnetron sputtering gun.

6. The process of claim 5 wherein the elements from which the crystal is formed are selected from the group consisting of Nb, Cu, Ni, and Ag.

* * * * *